United States Patent
Boschke et al.

(10) Patent No.: US 9,515,155 B2
(45) Date of Patent: Dec. 6, 2016

(54) E-FUSE DESIGN FOR HIGH-K METAL-GATE TECHNOLOGY

(71) Applicant: GLOBALFOUNDRIES Inc., Grand Kayman, KY (US)

(72) Inventors: Roman Boschke, Dresden (DE); Stefan Flachowsky, Dresden (DE); Maciej Wiatr, Dresden (DE); Christian Schippel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/136,815

(22) Filed: Dec. 20, 2013

(65) Prior Publication Data

US 2015/0179753 A1    Jun. 25, 2015

(51) Int. Cl.
  *H01L 29/49*   (2006.01)
  *H01L 21/285*  (2006.01)
  *H01L 23/62*   (2006.01)
  *H01L 23/525*  (2006.01)

(52) U.S. Cl.
  CPC ....... *H01L 29/4975* (2013.01); *H01L 23/5256* (2013.01); *H01L 23/62* (2013.01); *H01L 2924/0002* (2013.01)

(58) Field of Classification Search
  None
  See application file for complete search history.

(56) References Cited

U.S. PATENT DOCUMENTS

| | | | |
|---|---|---|---|
| 6,821,887 B2 | 11/2004 | Wieczorek et al. | |
| 2004/0251549 A1* | 12/2004 | Huang et al. | 257/758 |
| 2008/0079090 A1* | 4/2008 | Hwang | H01L 21/76804 257/384 |
| 2009/0026574 A1* | 1/2009 | Kim | H01L 23/5256 257/529 |
| 2009/0117274 A1* | 5/2009 | Ma | C07F 17/00 427/255.28 |
| 2010/0301417 A1* | 12/2010 | Cheng | H01L 27/0629 257/355 |
| 2011/0057267 A1 | 3/2011 | Chuang et al. | |
| 2012/0187528 A1* | 7/2012 | Cheng | H01L 23/5256 257/529 |

(Continued)

OTHER PUBLICATIONS

Office Action from related application U.S. Appl. No. 14/136,581 dated Feb. 20, 2015.

(Continued)

*Primary Examiner* — Calvin Choi
*Assistant Examiner* — Xiaoming Liu
(74) *Attorney, Agent, or Firm* — Amerson Law Firm, PLLC

(57) ABSTRACT

E-fuses are used in integrated circuits in order to permit real-time dynamic reprogramming of the circuit after manufacturing. An e-fuse is hereby proposed wherein the metal element adapted to be blown upon passage of a current is not comprised of a silicide layer but is rather a metal layer above which a semiconductor layer is formed. A dielectric layer is then formed on the semiconductor layer, in order to prevent metal silicide from forming over the metal layer. The process of manufacturing the e-fuse can be easily integrated in an HKMG manufacturing flow. In particular, fully silicided metal gates may be manufactured in conjunction with the e-fuse, without jeopardizing the correct functioning of the e-fuse.

23 Claims, 15 Drawing Sheets

(56) References Cited

U.S. PATENT DOCUMENTS

2012/0217589 A1     8/2012   Yin et al.
2015/0211126 A1*   7/2015   Ma

OTHER PUBLICATIONS

Final Office Action from related application U.S. Appl. No. 14/136,581 dated Aug. 17, 2015.
Office Action from related application U.S. Appl. No. 14/136,581 dated Feb. 19, 2016.
Final Office Action from related U.S. Appl. No. 14/136,581 dated Jun. 17, 2016.

* cited by examiner

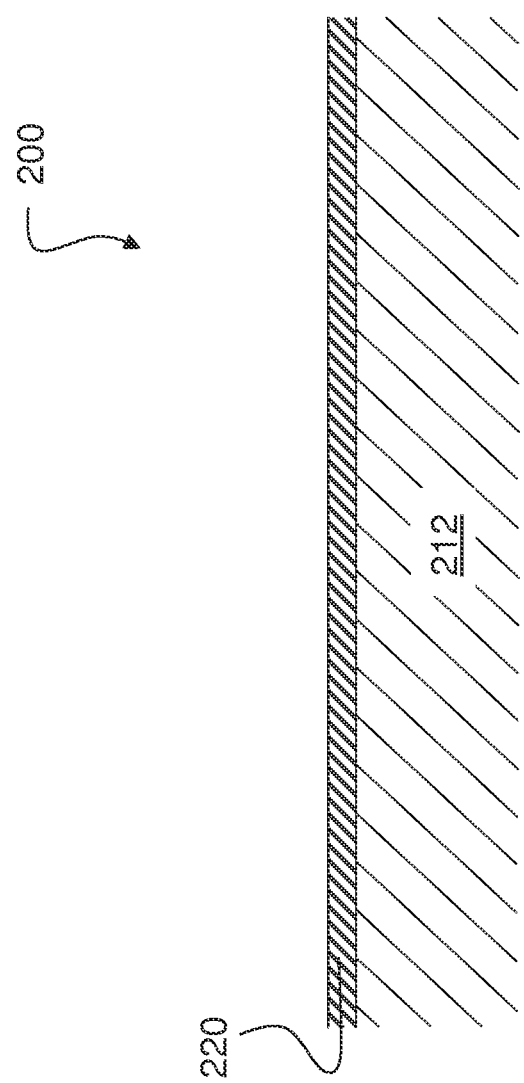

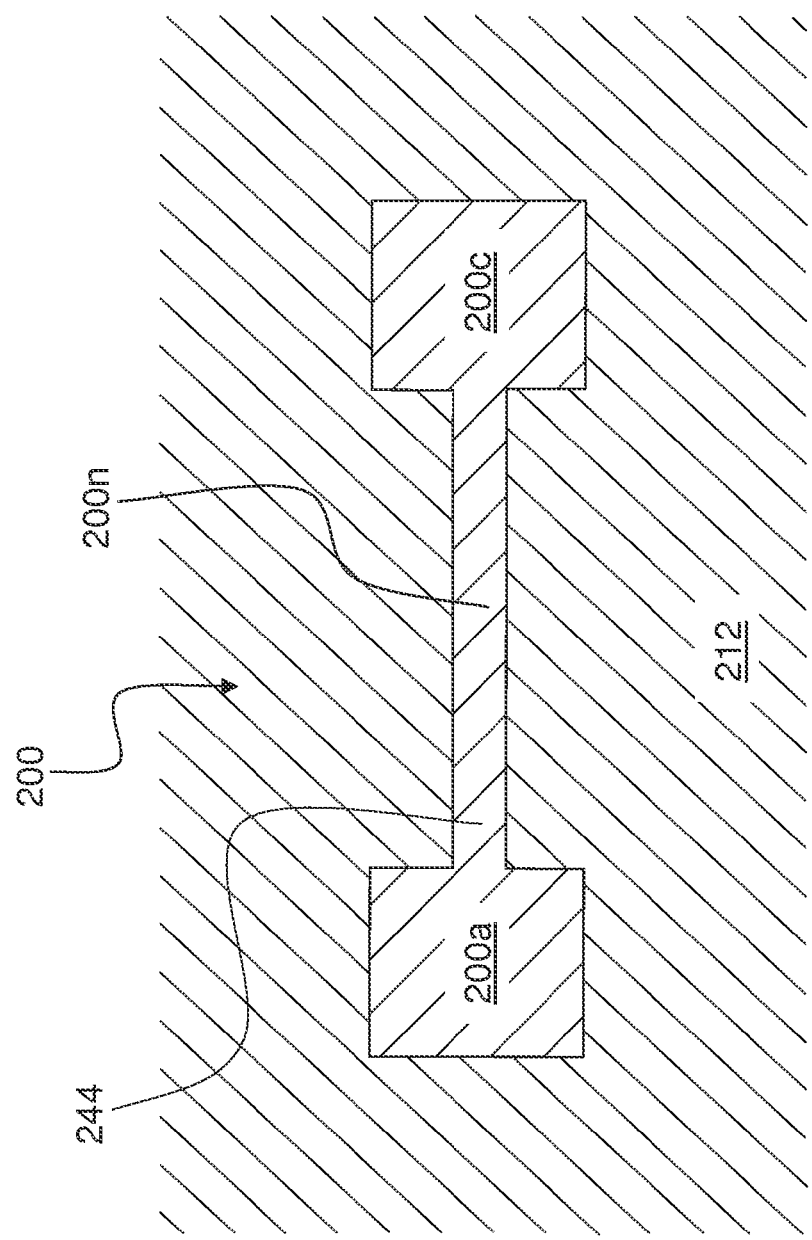

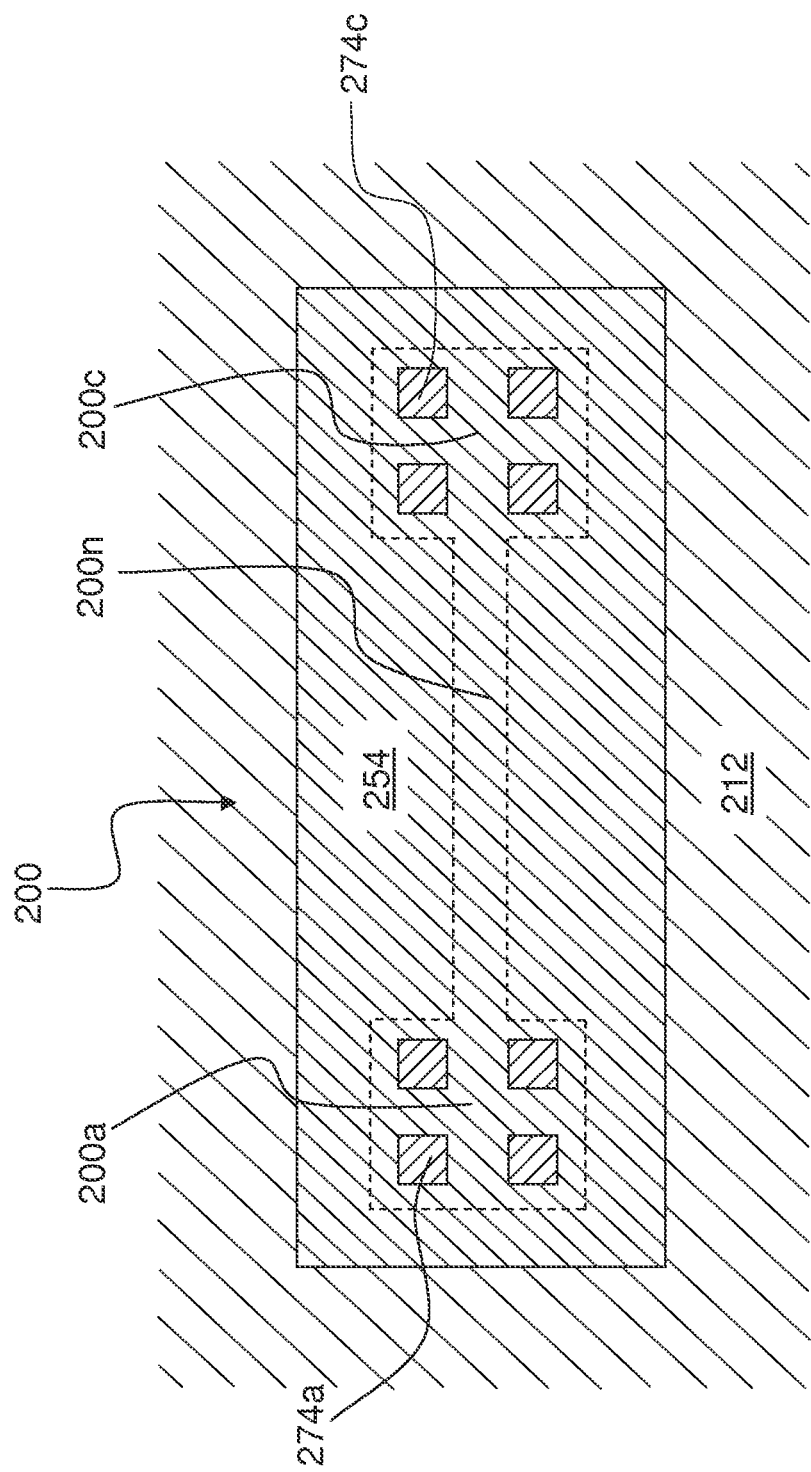

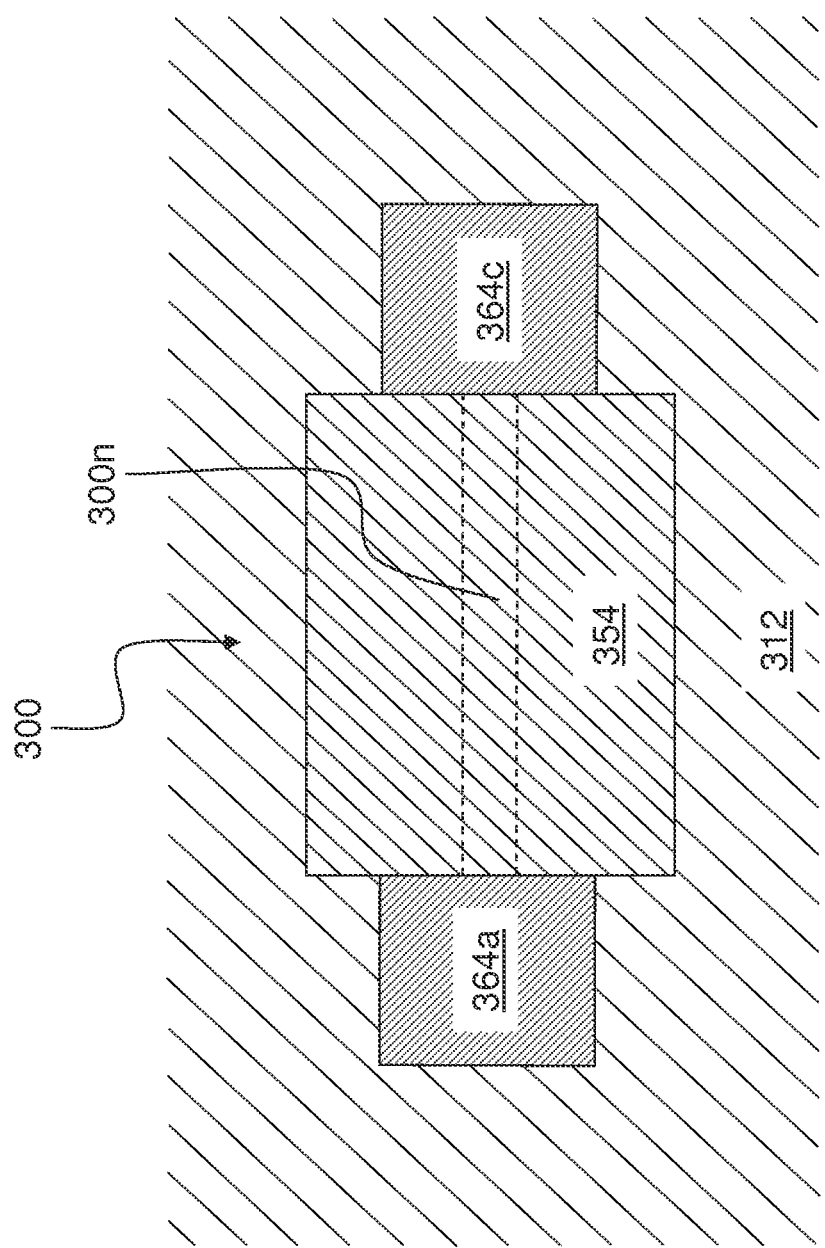

E-FUSE DESIGN FOR HIGH-K METAL-GATE TECHNOLOGY

BACKGROUND OF THE INVENTION

1. Field of the Invention

Generally, the present disclosure relates to integrated circuits, and, more particularly, to electrically programmable fuses (e-fuses) and methods of manufacturing thereof.

2. Description of the Related Art

Transistors are the dominant components in modern electronic devices. Currently, several hundred millions of transistors may be provided in presently available complex integrated circuits, such as microprocessors, CPUs, storage chips and the like. It is then crucial that the typical dimensions of the transistors included in an integrated circuit have as small as possible typical dimensions, so as to enable a high integration density.

One of the most widespread technologies is the complementary metal-oxide-semiconductor (CMOS) technology, wherein complementary field-effect transistors (FETs), i.e., P-channel FETs and N-channel FETs, are used for forming circuit elements, such as inverters and other logic gates to design highly complex circuit assemblies.

Transistors are usually formed in active regions defined within a semiconductor layer supported by a substrate. Presently, the layer in which most integrated circuits are formed is made out of silicon, which may be provided in crystalline, polycrystalline or amorphous form. Other materials such as, for example, dopant atoms or ions may be introduced into the original semiconductor layer.

When fabricating transistors with typical gate dimensions below 50 nm, the so-called "high-k/metal gate" (HKMG) technology has by now become the new manufacturing standard. According to the HKMG manufacturing process flow, the insulating layer included in the gate electrode is comprised of a high-k material. This is in contrast to the conventional oxide/polysilicon (poly/SiON) method, whereby the gate electrode insulating layer is typically comprised of an oxide, preferably silicon dioxide or silicon oxynitride, in the case of silicon-based devices.

Currently, two different approaches exist for implementing HKMG in the semiconductor fabrication process flow. In the first approach, called gate-first, the fabrication process flow is similar to that followed during the traditional poly/SiON method. Formation of the gate electrode, including the high-k dielectric film and the work function metal film, is initially performed, followed by the subsequent stages of transistor fabrication, e.g., definition of source and drain regions, silicidation of portions of the substrate surface, metallization, etc. On the other hand, according to the second scheme, also known as gate-last or replacement gate, fabrication stages, such as dopant ion implantation, source and drain region formation and substrate silicidation, are performed in the presence of a sacrificial dummy gate. The dummy gate is replaced by the real gate after the high temperature source/drain formation and all silicide annealing cycles have been carried out.

HKMG enables increasing the thickness of the insulation layer in the gate electrode, thereby significantly reducing leakage currents through the gate, even at transistor channel typical sizes as low as 30 nm or smaller. However, implementation of HKMG brings about new technological challenges and requires new integration schemes with respect to the conventional poly/SiON technology.

For example, new materials have to be found in order to tune the work function of gate electrode species, so as to adjust the transistor threshold voltage to a desired level.

Furthermore, in the HKMG technology, a thin "work function metal" layer is inserted between the high-k dielectric and the gate material placed above the high-k dielectric. The threshold voltage can thus be adjusted by varying the thickness of the metal layer. The gate metal layer may comprise, for example, tantalum (Ta), tungsten (W), titanium nitride (TiN) or tantalum nitride (TaN). On the other hand, the work function metal layer may comprise metals such as aluminum and lanthanum. Work function metals may also be included in the gate metal layer.

According to the gate-first HKMG approach, the gate structure is formed by depositing a stack of layers, which is subsequently appropriately patterned so as to obtain a gate structure of the desired size and dimensions. The stack includes the high-k material layer formed on the surface of the substrate, the gate metal layer formed above the high-k material layer, and a gate material layer formed on top of the gate metal layer.

Since the gate material layer is usually comprised of a semiconductor, for example polysilicon, a Schottky barrier is established at the interface between the gate metal layer and the gate semiconductor material. This undesirably degrades the AC performance of a semiconductor device by limiting the circuit switching speed.

A method of solving the problem of the Schottky barrier is forming a so-called "fully silicided" gate, i.e., a gate structure wherein the metal silicide completely replaces the semiconductor gate material, so as to directly form an interface with the gate metal layer. An example of a manufacturing method of a fully silicided metal gate can be found in U.S. Pat. No. 6,821,887.

Reducing the typical dimensions of integrated circuits also leads to an increased probability of failure of single chip components, which in turn results in a decrease of product yield. Typically, a damage of a component such as a single metal link, a transistor or a resistor causes the entire integrated circuit to be unusable. This is obviously in contrast with the semiconductor industry endeavor of achieving ever increasing product quality, reliability and throughput.

In order to improve the product yield, a technique has been developed of "trimming" or electrically excluding circuit blocks which are no longer operable. This technique, particularly used during manufacturing of memory arrays, relies on redundant circuit blocks which can be incorporated into the main integrated circuit and activated once a defective circuit portion has been detected. On the other hand, the defective circuit block may be trimmed or electrically removed by blowing a fuse or a group of fuses which can electrically disconnect the defective block from the main circuit when in the open configuration. Reprogramming of an integrated circuit is thus rendered possible in a dynamic manner, even after the chip has been manufactured.

One of the most successfully used types of fuses used for enabling dynamic chip reprogramming is the so-called electrically programmable fuse (e-fuse). The cross-section of a typical e-fuse 100 formed during a manufacturing flow according to the HKMG technology is shown in FIG. 1*a*.

An e-fuse 100 is formed on an isolation region 112 of a substrate (not shown). The substrate may be any appropriate carrier for a semiconductor integrated device. The isolation region 112 may, for example, have been formed by means of shallow trench isolation (STI). The e-fuse 100 includes a metal layer 124 formed above the surface of the isolation region 112. The material or material mixture constituting the layer 124 are typically the same as the material or material mixture making up the gate metal layer in the HKMG technology. Although not shown in the figure, a high-k dielectric layer may be interposed between the metal layer 124 and the surface of the isolation region 112.

A semiconductor layer 144 is then formed on the metal layer 124. The semiconductor material forming the layer 144 is preferably the same material used for forming the gate material layer on the gate metal layer. Thus, the semiconductor layer 144 is usually comprised of polysilicon. A metal silicide layer 164, typically nickel silicide, is finally formed on the surface of the semiconductor layer 144. The metal silicide layer 164 is conveniently formed during the same silicidation process used for forming electrical contacts to the electrodes (gate, source and drain) of a FET.

The metal silicide layer 164 includes a first electrode 164a and a second electrode 164c arranged at opposite ends of the layer 164. The first electrode 164a and the second electrode 164c could, for example, be the anode and the cathode of the e-fuse 100. Contact terminals 174a and 174b are then formed so as to provide an electrical connection to the first electrode 164a and the second electrode 164c, respectively. Contact terminals 174a and 174b are typically comprised of a metal with a high electrical conductivity.

When the e-fuse 100 is un-programmed, the metal silicide layer 164 is continuous and provides an electrical connection between the first electrode 164a and the second electrode 164b, thus presenting a low electrical resistance between terminals 174a and 174b. The e-fuse 100 may then be programmed by applying a predetermined electrical bias between terminals 174a and 174b, thereby inducing a current to flow across the e-fuse 100. Since the resistivity of the semiconductor layer 144 is much greater than that of the silicide layer 164, almost all current flows through the latter layer. If the current intensity exceeds a predetermined threshold, electromigration occurs in the silicide layer 164, resulting in transport of the metal silicide material constituting the layer 164 towards the anode. After a sufficient amount of material has been transferred to one of the two electrodes 164a and 164c representing the anode, the e-fuse 100 switches to the programmed state when a gap is formed in the metal silicide layer 164, thereby resulting in an open circuit between the two terminals 174a and 174b. The electrical resistance of the programmed e-fuse 100 thus rises by several orders of magnitude with respect to the resistance in the un-programmed state.

A problem arises when the e-fuse 100 is formed in the course of an HKMG manufacturing flow, wherein fully-silicided metal gate FETs are formed in the integrated circuit. In this case, an electrical contact is likely established between the topmost metal silicide layer 164 and the lower-lying metal layer 124 of the e-fuse 100, with extremely harmful consequences on the correct functioning of the e-fuse 100. In case of an electrical contact between the metal silicide layer 164 and metal layer 124, a substantial amount of current would flow through the metal layer 124, thus preventing the desired electromigration in the metal silicide layer 164 from taking place. This is mainly due to current crowding in the metal layer 124. The e-fuse 100 could, therefore, not be blown by inducing a current of a desired intensity and the desired high resistance between the first electrode 164a and the second electrode 164c cannot be achieved.

A need then arises for an e-fuse with an improved design and produced by means of a manufacturing flow which can be easily integrated in the HKMG manufacturing flow. Especially, an e-fuse would be desirable which can be efficiently manufactured during a HKMG manufacturing flow resulting in a fully silicided gate.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure is based on the new and inventive idea that the top silicide layer of an e-fuse can be conveniently replaced by a metal layer embedded in the e-fuse layer stack. This metal layer can conveniently be a portion of the gate metal layer used in the HKMG technology. Based on this idea, an electrically programmable fuse for an integrated semiconductor device is disclosed which includes a metal layer formed above the surface of a substrate having a first electrode and a second electrode formed at opposite end portions of the metal layer, a semiconductor layer formed on the metal layer, a silicidation protection layer at least partially formed on a portion of the semiconductor layer lying above a portion of the metal layer and electrical connections to the first electrode and the second electrode.

In this manner, the silicidation protection layer prevents the underlying semiconductor layer from being affected by the silicidation process normally undergone by a semiconductor device after FET formation. At least a portion of the semiconductor layer lying above a portion of the metal layer is, thus, protected from the silicidation process by the silicide protection layer. This enables formation of fully silicided metal gates, without jeopardizing the correct functioning of the e-fuse.

A method of forming a semiconductor structure is also provided which includes forming a metal layer above the surface of a substrate, forming a semiconductor layer on the metal layer, patterning the metal layer so as to form a first electrode and a second electrode at opposite end portions of the metal layer, forming a silicidation protection layer on a portion of the semiconductor layer lying above a portion of the metal layer and forming electrical connections to the first electrode and the second electrode.

BRIEF DESCRIPTION OF THE DRAWINGS

The disclosure may be understood by reference to the following description taken in conjunction with the accompanying drawings, in which like reference numerals identify like elements, and in which:

FIG. 2a shows a cross-sectional view of an e-fuse according to a first embodiment of the invention during an early manufacturing stage;

FIG. 2b shows a cross-sectional view of an e-fuse according to the first embodiment of the invention during a manufacturing stage subsequent to the stage shown in FIG. 2a;

FIG. 2d shows a top view of an e-fuse according to the first embodiment of the invention during the same manufacturing stage as shown in FIG. 2c;

FIG. 2h shows a top view of an e-fuse according to the first embodiment of the invention during the same manufacturing stage as shown in FIG. 2g;

FIG. 3b shows a top view of an e-fuse according to the second embodiment of the invention during the same manufacturing stage as shown in FIG. 3a;

FIG. 3f shows a top view of an e-fuse according to the second embodiment of the invention during the same manufacturing stage as shown in FIG. 3e.

Figure 1A:
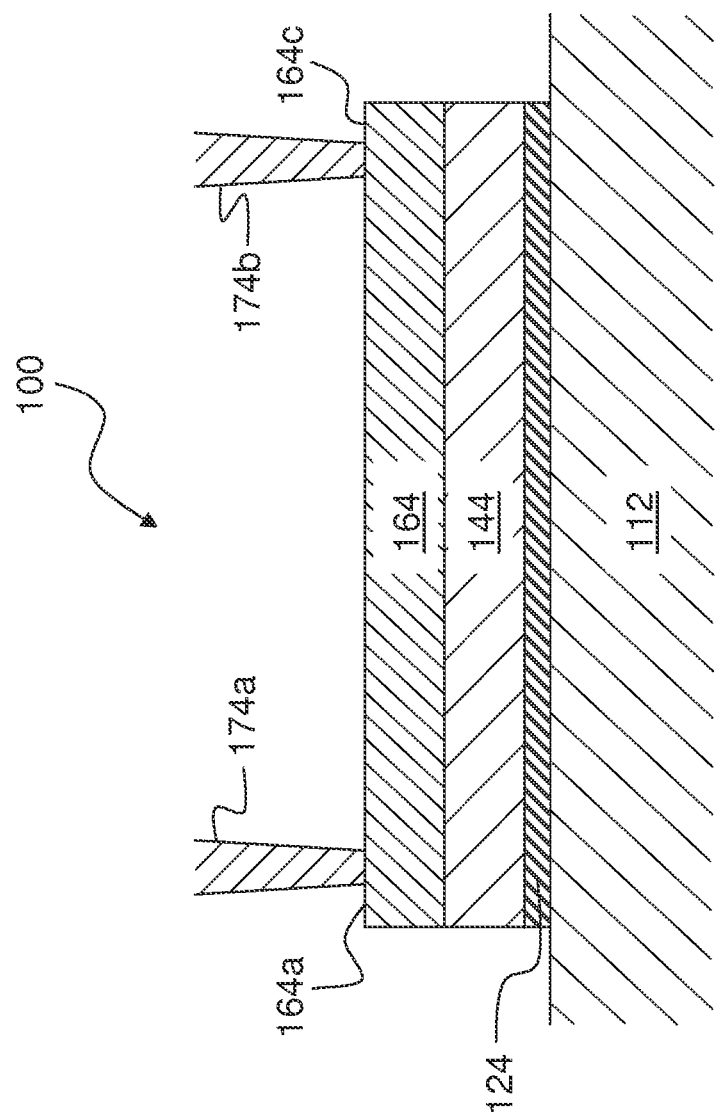
FIG. 1a schematically shows a cross-sectional view of an e-fuse according to the state of the art.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

It should be understood that, unless otherwise specifically indicated, any relative positional or directional terms that may be used in the descriptions below—such as "upper," "lower," "on," "adjacent to," "above," "below," "over," "under," "top," "bottom," "vertical," "horizontal" and the like—should be construed in light of that term's normal and everyday meaning relative to the depiction of the components or elements in the referenced figures. For example, referring to the schematic cross-section of the e-fuse 200 depicted in FIG. 2a, it should be understood that the layer 220 is formed "above" the surface of the isolation region 212, whereas the layer 220 is formed "on" the surface of the isolation region 212 in those instances in which no other material is present between the layer 220 and the isolation region 212.

FIG. 2a shows a cross-sectional view of an e-fuse 200 according to an embodiment of the invention in an early manufacturing stage. The e-fuse 200 is formed on the surface of an isolation region 212 of a substrate (not shown). The substrate may be any suitable carrier for an integrated semiconductor device. For example, the substrate may be comprised of a semiconductor material in a crystalline, polycrystalline or amorphous form. The substrate could comprise an oxide sandwiched between two semiconductor layers, such as those used in the silicon-on-insulator (SOI) technology. A semiconductor layer, for example comprising mono-crystalline silicon, could then be formed in the substrate. The semiconductor layer could then be divided into a plurality of active regions, each of them adapted to host one or more N-channel FETs and/or P-channel FETs.

The isolation region 212 could, for example, separate neighboring active regions of the semiconductor layer. The isolation region 212 could comprise an oxide, such as, for example, silicon dioxide ($SiO_2$), and could be formed by means of a well-established technique. For example, the isolation region 212 could be formed by means of local oxidation of silicon (LOCOS), or preferably by the shallow trench isolation (STI) technique. STI is particularly suitable for highly integrated devices, e.g., for semiconductor manufacturing technologies beyond the 0.5-μm technology.

The e-fuse 200 further comprises a metal layer 220 formed above the surface of the isolation region 212. The metal layer 220 may comprise a material or a mixture of materials used for forming the gate metal layer on the high-k material layer in the HKMG technology. Thus, in some embodiments, the metal layer 220 comprises at least one of titanium nitride (TiN), tantalum nitride (TaN), tantalum (Ta), tungsten (W). However, the metal materials constituting the metal layer 220 are not limited to those listed above and any suitable metal may be used. In some embodiments, the metal layer 220 is formed by using the same deposition step as used for depositing the layer out of which the gate metal layer is obtained after patterning.

Although not shown in the figures, a high-k material layer may have been formed between the isolation region 212 and the metal layer 220. This high-k material layer may comprise the materials constituting the gate dielectric layer in the HKMG technology. In particular, the high-k material layer below the metal layer 220 could be formed by means of the same deposition as used for forming the dielectric layer, giving rise to the gate dielectric layer after an appropriate patterning step. The high-k material layer could, thus, comprise dielectric materials such as hafnium oxide ($HfO_2$), hafnium silicon oxide (HfSiO), tantalum oxide ($Ta_2O_5$), strontium titanium oxide ($SrTiO_3$), zirconium oxide ($ZrO_2$) and the like.

A work function material layer, for example comprising aluminum or lanthanum, could then be arranged between the high-k dielectric layer and the metal layer 220. Alternatively or additionally, work function metals such as aluminum or lanthanum may be present with a predetermined concentration in the metal layer 220.

Figure 2B:
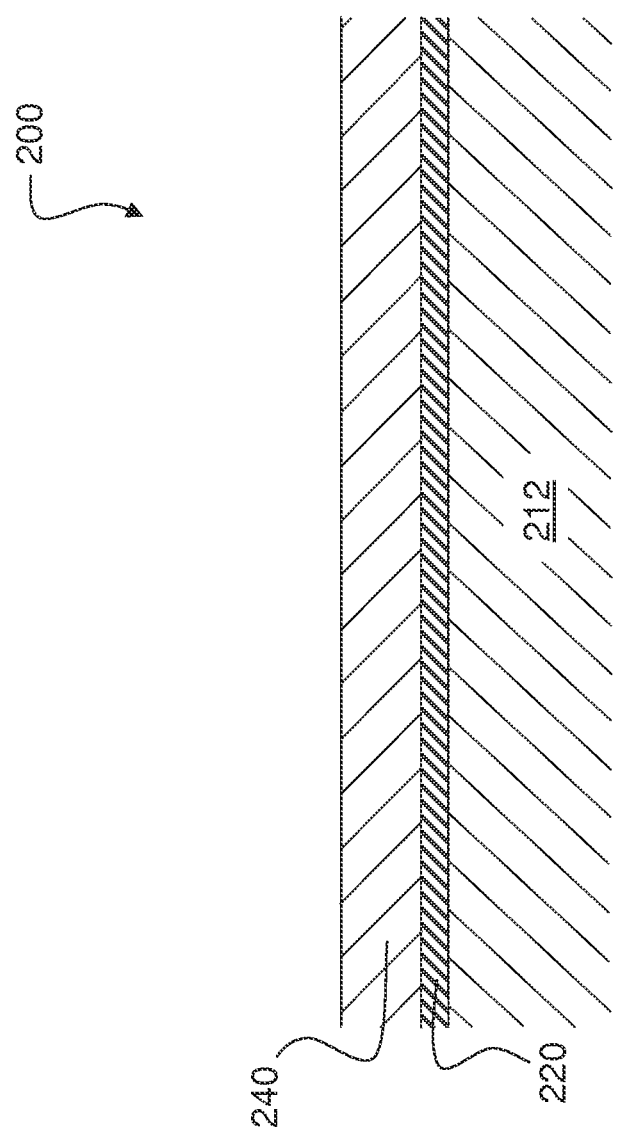

FIG. 2b shows the e-fuse 200 in a manufacturing stage subsequent to that shown in FIG. 2a. After depositing the metal layer 220, a semiconductor layer 240 is formed on the metal layer 220. In some embodiments, the semiconductor layer 240 may be conveniently formed by means of the same deposition process used for forming the semiconductor layer, which, after an appropriate patterning step, gives rise to the semiconductor gate material formed on the gate metal layer in the HKMG technology. Thus the semiconductor layer 240 may conveniently comprise silicon. According to a particular embodiment, the semiconductor layer 240 comprises polycrystalline silicon.

Figure 2C:
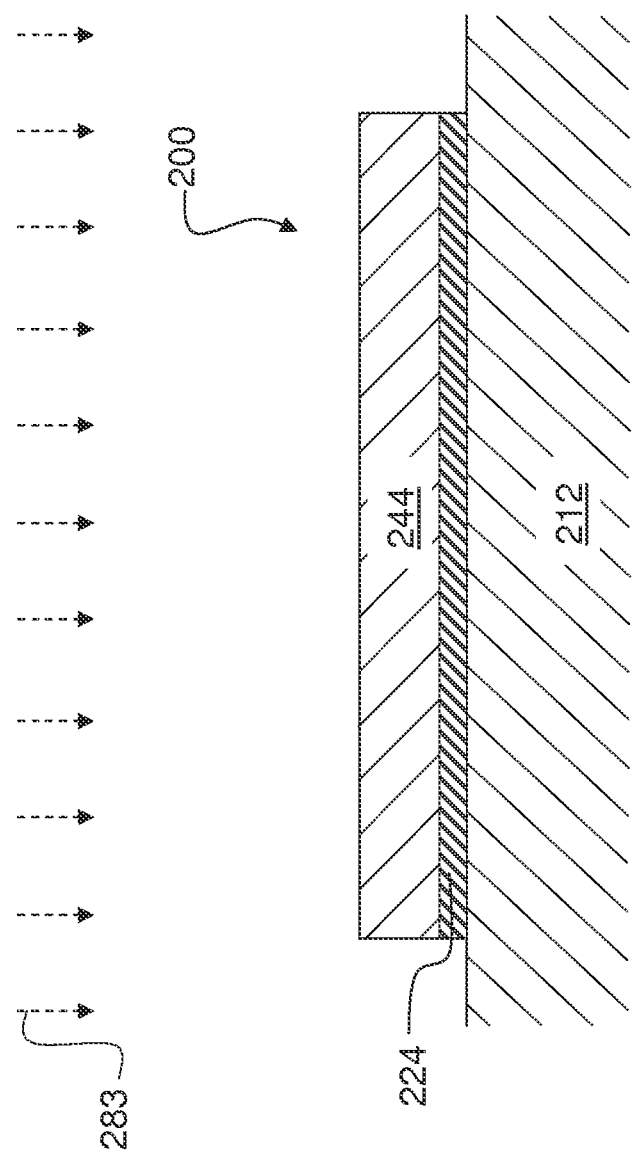
FIG. 2c shows a cross-sectional view of an e-fuse according to the first embodiment of the invention during a manufacturing stage subsequent to the stage shown in FIG. 2b.

FIGS. 2c and 2d show a cross-section and a top view, respectively, of the e-fuse 200 in a manufacturing stage subsequent to that shown in FIG. 2b. After depositing the metal layer 220 and the semiconductor layer 240, a patterning process 283 is carried out in order to structure the layers 220 and 240. The patterning process 283 might comprise a photolithography step performed in order to form a pattern in a photoresist layer deposited on the surface of the e-fuse 200. The photolithography step, performed, for example, with the aid of a shadow mask, may then be followed by one or a series of etches carried out in order to transfer the pattern from the photoresist layer to the metal layer 220 and the semiconductor layer 240. In other implementations, the patterning 283 may be performed by using one or more wet or dry etches after laying a hard mask having the desired pattern on the surface of the e-fuse 200. In a particularly convenient embodiment, the patterning 283 is the same patterning step used for structuring the gate structure of a FET manufactured according to the HKMG technology.

The patterning 283 causes the undesired portion of the layers 220 and 240 to be removed. As shown in FIGS. 2c and 2d, after patterning 283, the e-fuse 200 is comprised of a portion 224 of the metal layer 220 and a portion 244 of the semiconductor layer 240. For the sake of convenience, the metal layer portion 224 and the semiconductor layer portion 244 will also be henceforth referred to as the metal layer and the semiconductor layer of the e-fuse 200, respectively.

It should be noted that, in the embodiment shown in FIGS. 2c and 2d, patterning 283 results in the metal layer 220 and the semiconductor layer 240 being structured so as to have the same shape. Since according to this embodiment patterning 283 is performed by using the same photoresist mask or hard mask when etching the metal layer 220 and the semiconductor layer 240, the metal layer portion 224 and the semiconductor layer portion 244 resulting from patterning 283 have the same shape, i.e., the patterned semiconductor layer 244 covers the entire upper surface of the patterned layer portion 224 without extending over surface areas where the patterned metal layer 224 is not present. In other embodiments, not shown in the figures, the metal layer 220 is deposited and patterned before deposition of the semiconductor layer 240. The semiconductor layer 240 is subsequently deposited on the patterned metal layer 224 and, if desired, may also be patterned in order to assume a desired shape. After patterning, the semiconductor layer preferably covers at least the entire surface of the underlying patterned metal layer.

Again with reference to FIGS. 2c and 2d, the patterned metal layer 224 and the patterned semiconductor layer 244 are structured so that the e-fuse 200 has a first end portion 200a and a second end portion 200c arranged opposite each other, as shown in FIG. 2d. The left-hand portion of the metal layer 224 included in the first end portion 200a comprises a first electrode of the e-fuse 200. Analogously, the right-hand portion of the metal layer 224 included in the second end portion 200c comprises a second electrode of the e-fuse 200. For example, the first electrode could be the anode and the second electrode the cathode of the e-fuse 200, or vice versa. Thus, the anode and cathode of the e-fuse 200 are included in opposite end portions of the patterned metal layer 224.

Also shown in FIG. 2d is that, after patterning 283, the metal layer 224 and the semiconductor layer 244 comprise a narrow portion or neck 200n arranged between the first end portion 200a and the second end portion 200b. The width (dimension along the vertical direction in FIG. 2d) of the narrow portion 200n is considerably less than the width of both the first end portion 200a and the second end portion 200c of the e-fuse 200. The narrow portion 200n of the metal layer 224 is adapted to form an interruption upon flow of a current exceeding a predetermined threshold intensity. The current can be induced through the narrow portion 200n of the metal layer 224 by applying an electric bias between the first and the second electrodes of the e-fuse 200, as will be explained more extensively in the following.

Figure 2E:
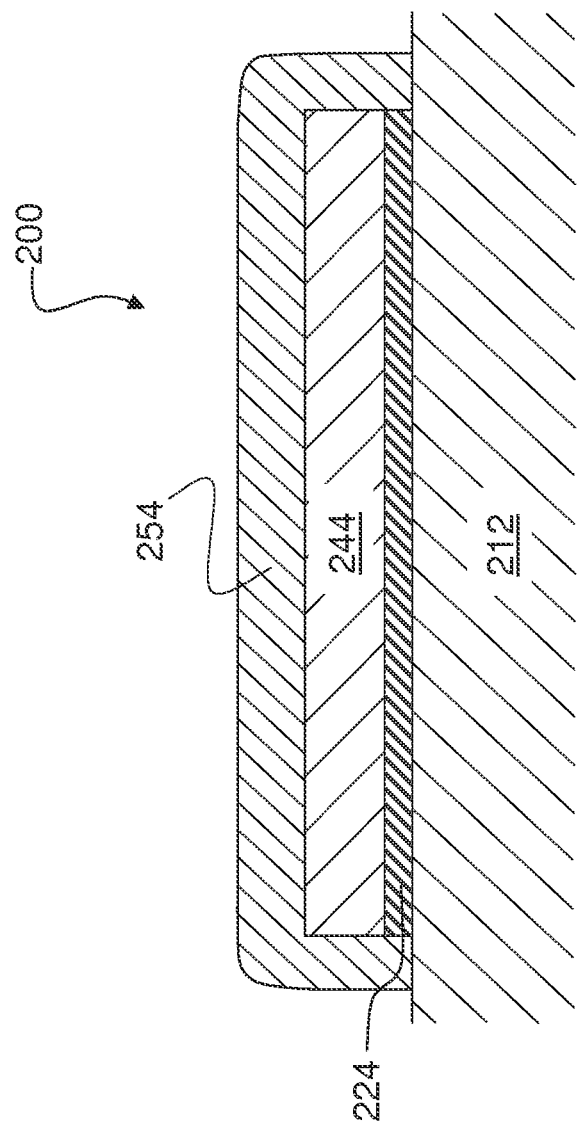
FIG. 2e shows a cross-sectional view of an e-fuse according to the first embodiment of the invention during a manufacturing stage subsequent to the stage shown in FIGS. 2c and 2d.
Figure 2F:
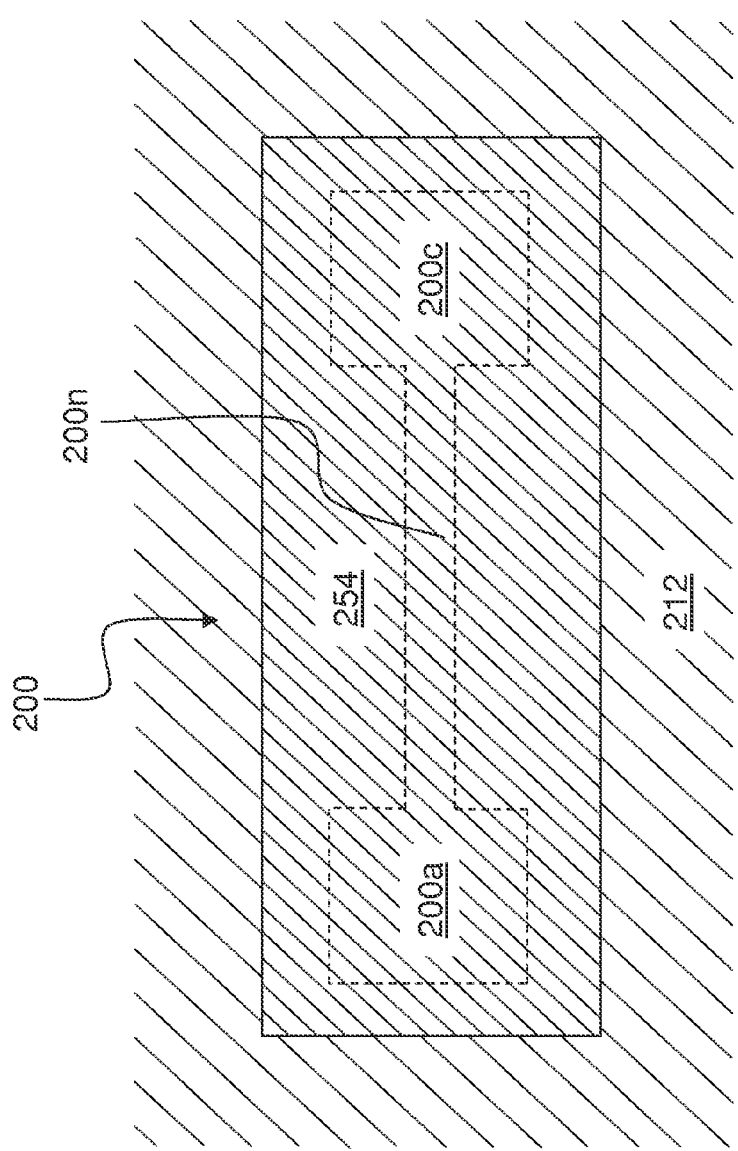
FIG. 2f shows a top view of an e-fuse according to the first embodiment of the invention during the same manufacturing stage as shown in FIG. 2e.

FIGS. 2e and 2f show a cross-section and a top view, respectively, of the e-fuse 200 in a manufacturing stage subsequent to that shown in FIGS. 2c and 2d.

After forming the patterned metal layer 224 and the patterned semiconductor layer 244, a silicidation protection layer 254 is deposited on the surface of the e-fuse 200. As shown in FIGS. 2e and 2f, the deposited protection layer 254 is patterned after being deposited so as to cover at least the entire exposed surface of the semiconductor layer 244. In particular, as shown in FIG. 2f, the silicidation protection layer 254 is patterned so as to have a rectangular shape, although other shapes are equally possible, as long as the surface of the silicidation protection layer 254 covers the entire surface of the semiconductor layer 244.

The silicidation protection layer 254 may comprise a dielectric material such as, for example, silicon nitride ($Si_3N_4$) or silicon dioxide ($SiO_2$). The silicidation protection layer 254 may conveniently be deposited and patterned when forming and patterning the spacer structures on the sidewalls of a transistor gate structure during an HKMG manufacturing flow. However, the silicidation protection layer 254 may be formed by means of a deposition followed by a patterning process carried out during any appropriate manufacturing stage prior to the silicidation process performed in order to form a metal silicide layer electrically contacting the electrodes of the FETs included in the integrated circuit, as described more extensively below. Preferably, the silicidation protection layer 254 is formed after forming the gate structure of the FETs.

It should be also noted that the materials included in the silicidation protection layer 254 are not limited to $Si_3N_4$ or silicon dioxide $SiO_2$. Conversely, the silicidation protection layer 254 may comprise any appropriate material, preferably a dielectric material, which, when undergoing a well-established silicidation process, does not react with a metal, such as nickel and the like, so as to form a metal silicide layer.

The integrated circuit in which the e-fuse 200 is included usually undergoes a silicidation process after the silicidation protection layer 254 has been formed. The silicidation process is well established and is aimed at forming a metal silicide layer on the surface of the source/drain regions and of the gate structures of the FETs formed in the integrated circuit. The silicidation process starts with deposition of a metal film, typically nickel, followed by a heating step triggering a chemical reaction between the metal particles of the deposited film in contact with those portions of the circuit surface exposing a semiconductor, typically silicon. It should be noted that metal silicide is not formed in correspondence to those portions of the circuit surface exposing $Si_3N_4$ or $SiO_2$, since silicon in those materials is strongly bound to the lattice structure and does not react with the metal.

The main purpose of the silicidation protection layer 254 is to prevent the semiconductor layer 244 from reacting with the metal during the silicidation process. As the material comprising the silicidation protection layer 254 does not react with the metal particles (e.g., nickel particles) during the silicidation process, the semiconductor layer 244 is not affected by the silicidation process and no metal silicide is formed in or on top of e-fuse 200.

Figure 2G:
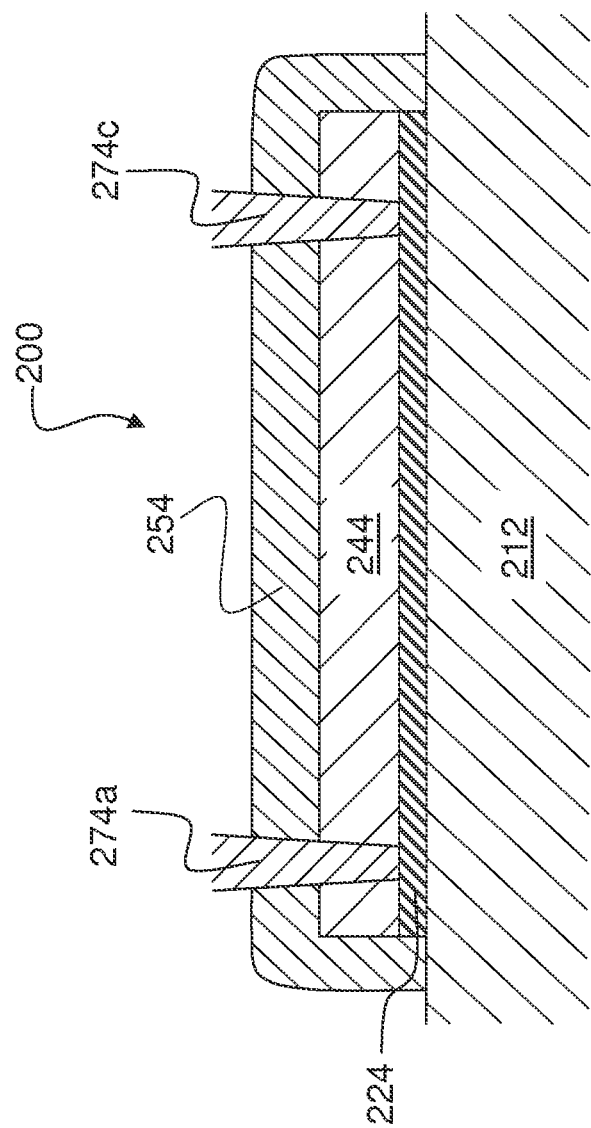
FIG. 2g shows a cross-sectional view of an e-fuse according to the first embodiment of the invention during a manufacturing stage subsequent to the stage shown in FIGS. 2e and 2f.

FIGS. 2g and 2h show a cross-sectional view and a top view, respectively, of the e-fuse 200 in a manufacturing stage subsequent to that shown in FIGS. 2e and 2f. After forming and patterning the silicidation protection layer 254 and, where needed, after performing a silicidation process, electrical contacts 274a and 274c are formed in correspondence to the first end portion 200a and the second end portion 200c of the e-fuse 200.

Contacts 274a and 274c are obtained by forming respective apertures extending through both the silicidation protection layer 254 and the semiconductor layer 244 so as to expose predetermined portions of the metal layer 224. In particular, apertures hosting contacts 274a expose portions of the metal layer 224 included in a first electrode of the e-fuse 200, whereas apertures hosting contacts 274c expose portions of the metal layer 224 included in a second electrode of the e-fuse 200. The first electrode could be the anode and the second electrode could the cathode of the e-fuse 200, or vice versa.

The apertures thus formed are then filled with a metal having a high electrical conductivity. For example, the metal included in contacts 274a and 274c could comprise copper, tungsten, aluminum and the like. The metal in contacts 274a and 274c is thus in electrical contact with the two electrodes of opposite polarity included in the metal layer 224, thus providing an electrical connection to the anode and cathode of the e-fuse 200. In convenient embodiments, contacts 274a and 274c are formed during the manufacturing stage in which electrical contacts to the electrodes of the FETs in the integrated circuit are formed. Contacts to transistor electrodes are typically formed after forming the transistors and depositing an interlayer dielectric (ILD) on the surface of the integrated circuit.

In the embodiment shown in FIG. 2h, four contacts 274a have been formed to the first electrode and four contacts 274c have been formed to the second electrode. However, the number of contacts is not particularly limited. In general, the greater the number of contacts is, the lower is the electrical resistivity to the contacted electrode. Furthermore, increasing the number of contacts usually permits more effective dissipation of the heat generated upon current flow. Thus, the number of contacts can be chosen at will depending on the needs and the circuit specifications.

The e-fuse 200 shown in FIGS. 2c-2h is in the un-programmed state, wherein a low resistance value is measured between contacts 274a and 274c, since the metal layer 244 is continuous. When an electrical bias is established between contacts 274a and contacts 274c, a current flows across the metal layer 224. If the current intensity exceeds a threshold, electromigration occurs, resulting in transport of metal constituting the metal layer 224 from the cathode to the anode, i.e., from the first end portion 200a to the second end portion 200c, or vice versa. Electromigration results in wear and increasing thinning of the narrow portion 200n of the metal layer 224. After a sufficient amount of metal has been transferred to the anode, an interruption of the metal layer 224 is formed in correspondence to the narrow portion 200n. As a consequence, the metal layer 224 is split into two completely disconnected portions. The formation of the interruption causes the resistance between contacts 274a and 274c to increase by several orders of magnitude and the e-fuse 200 to switch from the un-programmed to the programmed state.

Thanks to the manufacturing method described above, an efficient e-fuse may be produced which is not affected by any silicidation process performed on the integrated circuit in which the e-fuse is included. The method can be fully and conveniently integrated in a typical HKMG process flow and, in particular, in a HKMG process flow according to the gate-first approach. Even if transistors with a fully silicided gate are to be manufactured, the e-fuse maintains its correct functionality, since the element adapted to be blown is not comprised of the metal silicide layer formed on the surface of the circuit, but rather of a metal layer duly protected from silicidation by means of an appropriate silicidation protection layer.

FIGS. 3a-3e show a further embodiment of the e-fuse and the method of manufacturing thereof according to the invention. It should be noted that, where appropriate and unless otherwise stated, the reference numbers used in describing the various elements illustrated in FIGS. 3a-3f substantially correspond to the reference numbers used in describing the corresponding elements illustrated in FIGS. 2a-2h above, except that the leading numeral for corresponding features has been changed from a "2" to a "3". For example, the e-fuse 200 corresponds to the e-fuse 300, the metal layer 220 corresponds to the metal layer 320, the semiconductor layer 240 corresponds to the semiconductor layer 340, and so on. Accordingly, the reference number designations used to identify some elements of the presently disclosed subject matter may be illustrated in FIGS. 3a-3f but may not be specifically described in the following disclosure. In those instances, it should be understood that the numbered elements shown in FIGS. 3a-3f which are not described in detail below substantially correspond with their like-numbered counterparts illustrated in FIGS. 2a-2h, and described in the associated disclosure set forth above.

Figure 3A:
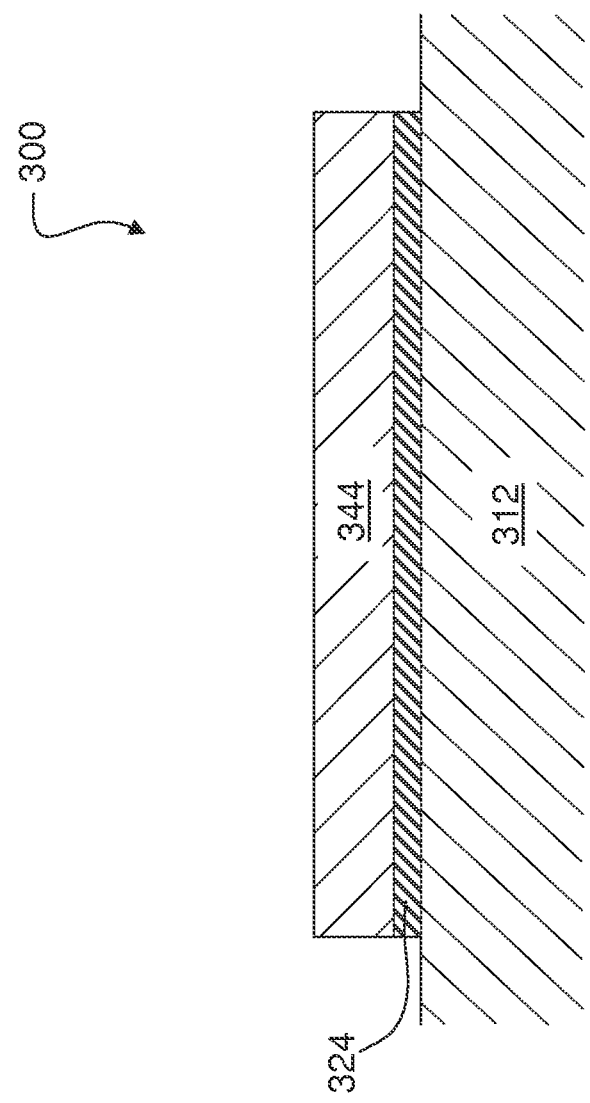
FIG. 3a shows a cross-sectional view of an e-fuse according to a second embodiment of the invention during a manufacturing stage.
Figure 3B:
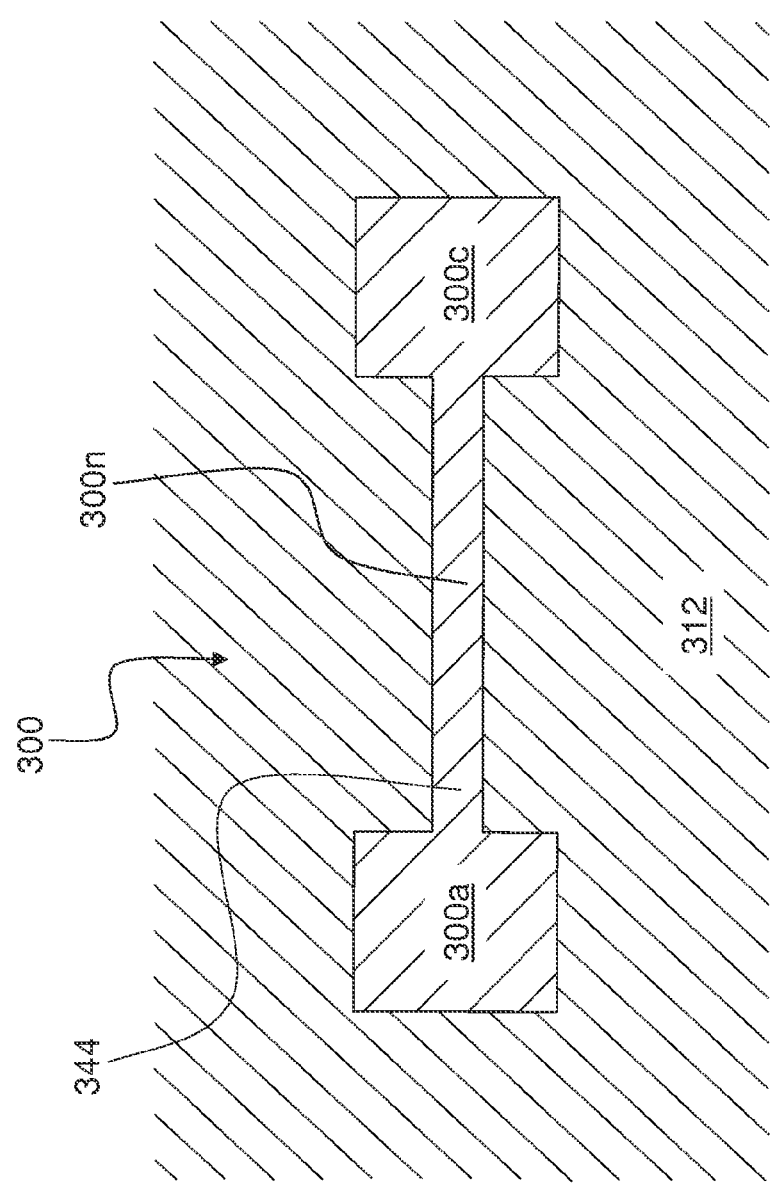

FIGS. 3a and 3b show an e-fuse 300 in a manufacturing stage substantially corresponding to that described above with reference to FIGS. 2c and 2d. The e-fuse 300 is formed on an isolation region 312 and comprises a patterned metal layer 324 formed above the isolation region 312 and a patterned semiconductor layer 344 formed on the metal layer 324.

As shown in FIG. 3b, the metal layer 324 and the semiconductor layer 344 are patterned so as to form a first end portion 300a and a second end portion 300c of the e-fuse 300 having an enlarged size. The patterned metal layer 324 and the semiconductor layer 344 each further comprise a narrow portion 300n situated between end portions 300a and 300c and having a width (dimension along the vertical direction in FIG. 3b) less than the width of both end portions 300a and 300c. As said above in relation to the previous embodiment, it is possible to pattern the metal layer and the semiconductor layer independently from each other, so as to form them with different shapes. Also in this case, it is preferable that the patterned semiconductor layer 344 covers the entire upper surface of the patterned metal layer 324.

Figure 3C:
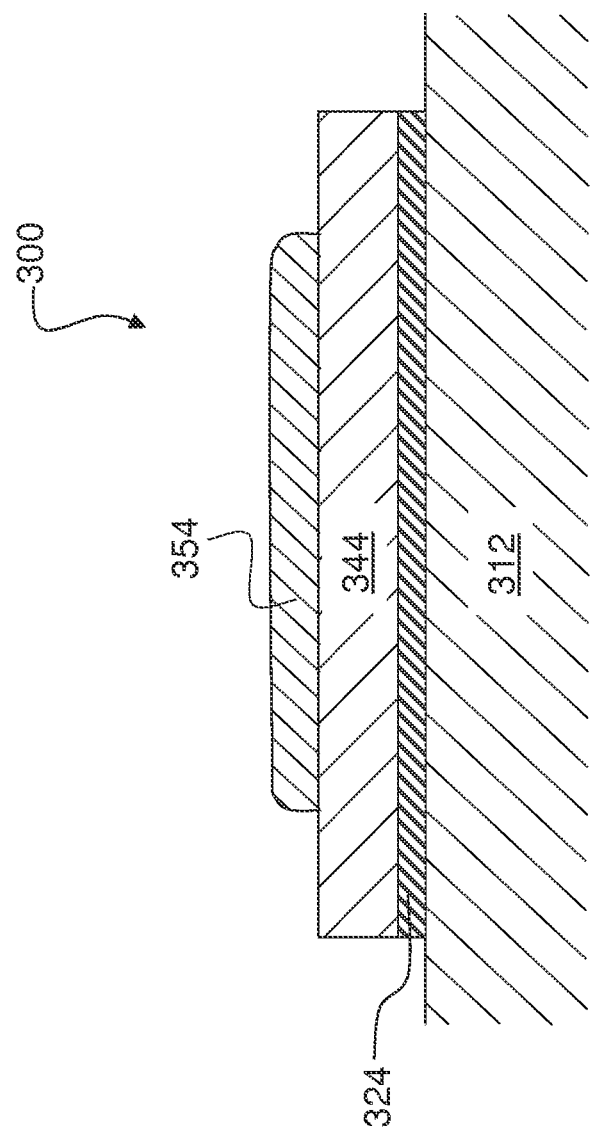
FIG. 3c shows a cross-sectional view of an e-fuse according to the second embodiment of the invention during a manufacturing stage subsequent to the stage shown in FIGS. 3a and 3b.
Figure 3D:
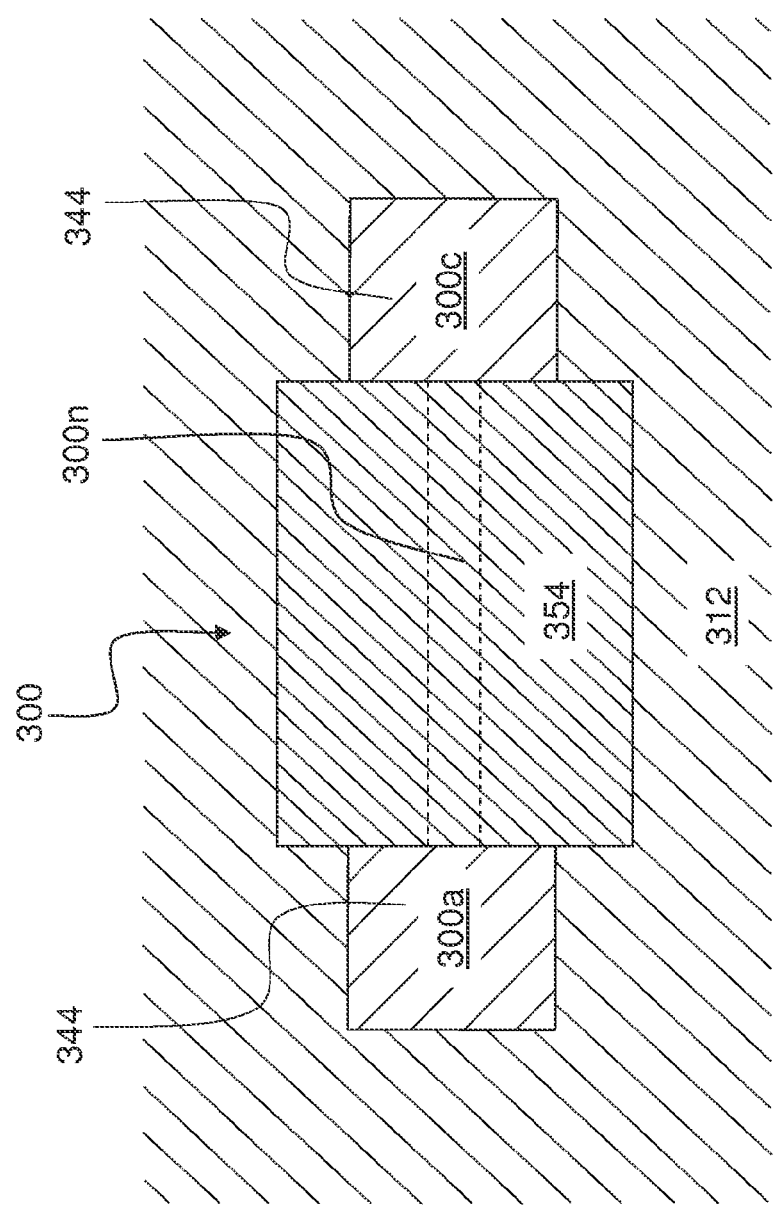
FIG. 3d shows a top view of an e-fuse according to the second embodiment of the invention during the same manufacturing stage as shown in FIG. 3c.

FIGS. 3c and 3d show a cross-sectional view and a top view, respectively, of the e-fuse 300 in a manufacturing stage subsequent to that shown in FIGS. 3a and 3b. After depositing and patterning the metal layer 324 and the semiconductor layer 344, a silicidation protection layer 354 is deposited on the surface of the e-fuse 300 and subsequently patterned. FIGS. 3c and 3d show the e-fuse 300 after the silicidation protection layer 354 has been patterned.

As explained above when discussing the previous embodiment with reference to FIGS. 2e and 2f, the silicidation protection layer 354 may comprise any suitable material, preferably a dielectric, which does not react with metals, such as nickel, when undergoing a silicidation process. The silicidation protection layer 354, which may, for example, comprise $Si_3N_4$ or $SiO_2$, may be deposited when depositing the dielectric layer adapted to be patterned to form spacer structures on the sidewalls of respective transistor gate structures. Alternatively, the silicidation protection layer 354 may be formed at any point of the manufacturing flow prior to the silicidation process.

The main difference between the embodiment being discussed and the embodiment illustrated above lies in the manner of patterning the silicidation protection layer. According to the embodiment shown in FIGS. 3c and 3d, the silicidation protection layer 354 is patterned so as to only partially cover the upper surface of the semiconductor layer 344. More precisely, the silicidation protection layer 354 is patterned so as to only cover the upper surface portion of the semiconductor layer 344 lying directly above the narrow portion 300n of the metal layer 324. By saying that a point A lies "directly above" a surface S, it is here implicitly intended that surface S is included in a plane and that the orthogonal projection of point A onto that plane is included in surface S.

It should be noted that, since in the embodiment shown in FIGS. 3a-3f the metal layer 324 and the semiconductor layer 344 have been patterned so as to have the same shape, the semiconductor layer 344 also comprises a narrow portion 300n and the silicidation protection layer 354 covers only the surface portion of the semiconductor layer 344 included in the narrow portion 300n.

Again with reference to FIGS. 3c and 3d, according to the embodiment shown therein, the silicidation protection layer 354 leaves at least partially exposed the surface portions of the semiconductor layer 344 included in the first end portion 300a and the second end portion 300c of the e-fuse 300. It should be noted that the surface portions of the semiconductor layer 344 left exposed by the silicidation protection layer 354 lie directly above the electrodes, e.g., anode and cathode, of the e-fuse 300.

Figure 3E:
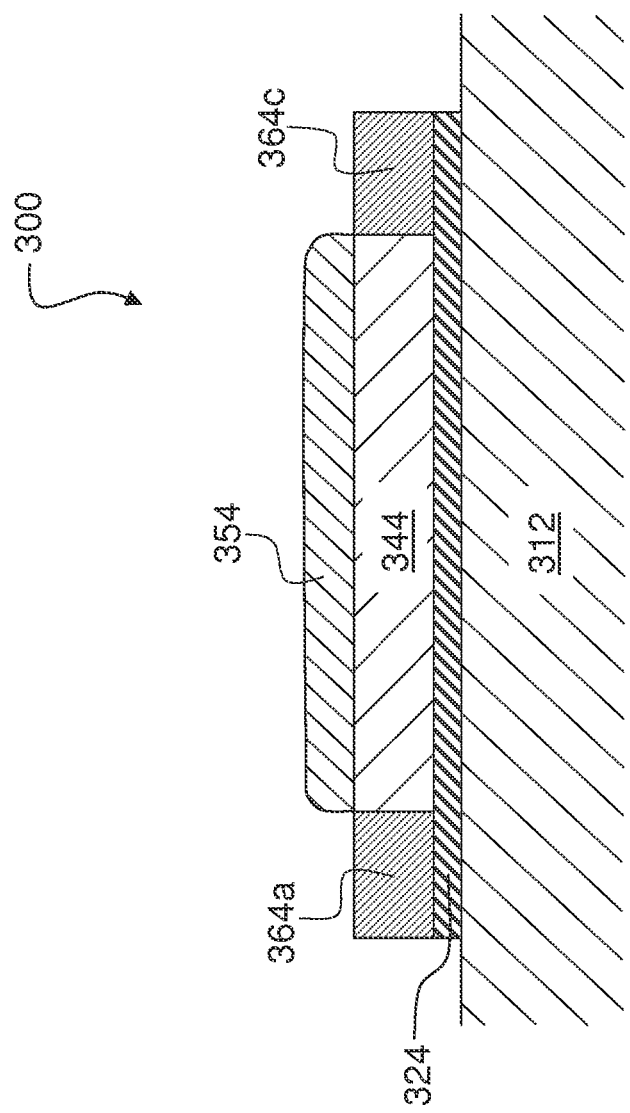
FIG. 3e shows a cross-sectional view of an e-fuse according to the second embodiment of the invention during a manufacturing stage subsequent to the stage shown in FIGS. 3c and 3d.

FIGS. 3e and 3f show a cross-sectional view and a top view, respectively, of the e-fuse 300 in a manufacturing stage subsequent to that shown in FIGS. 3c and 3d. After forming the silicidation protection layer 354, the e-fuse 300 undergoes a silicidation process, occurring as outlined above. A metal film is deposited on the surface of the integrated circuit including the e-fuse 300 and a heat treatment is subsequently applied in order to promote a chemical reaction between the metal particles and the semiconductor with which the film is in contact.

Since the silicidation protection layer 354 does not react with the metal of the deposited film during the silicidation, no metal silicide is formed in correspondence to the surface portion of the semiconductor layer 344 covered by the protection layer 354. Thus, no silicide is formed above the narrow portion 300n of the metal layer 324. Conversely, since the end portions 300a and 300b expose the semiconductor material of the semiconductor layer 344 prior to deposition of the metal film, metal silicide layers 364a and 364c are formed during the silicidation process in correspondence to the first end portion 300a and the second end portion 300c of the e-fuse 300, respectively. The metal silicide layers 364a and 364c typically comprise nickel silicide.

FIGS. 3e and 3f show a convenient embodiment wherein the silicidation process is adjusted so that all semiconductor material included in the exposed portions of the semiconductor layer 344 reacts with the metal. In this manner, both metal silicide layers 364a and 364c form an interface with the metal layer 324. In this manner, the metal silicide layers 364a and 364c provide an electrical connection to the electrodes of the e-fuse 300.

The functioning of the e-fuse 300 is analogous to that described above in relation to e-fuse 200. An electrical bias can be applied between the metal silicide layer 364a and the metal silicide layer 364c. This causes an electrical current to flow through the metal layer 324. When the current exceeds a predetermined threshold, electromigration occurs in the metal layer 324, eventually resulting in rupture of the metal layer 324. This causes the electrical resistance between the metal silicide layers 364a and 364c to dramatically increase and the e-fuse 300 to switch from the un-programmed to the programmed state.

In addition to the benefits described above in relation to the e-fuse 200, the e-fuse 300 according to the second embodiment entails the advantage that the silicidation process routinely carried out during integrated circuit manufacturing can be used for forming electrical connections to the electrodes of the e-fuse. Thus, no extra additional step in the manufacturing flow has to be introduced in order to form the electrical contacts. For example, no apertures have to be formed and filled with metal in order to reach the metal layer.

The claimed e-fuse and method find a particularly advantageous application in conjunction with the HKMG technology. The manufacturing process can be immediately integrated in an HKMG manufacturing flow. In particular, the e-fuse hereby proposed operates correctly even when formed during a manufacturing flow wherein fully silicided gates are produced.

These advantageous effects are achieved by using a metal layer buried under a semiconductor layer as the element of the fuse adapted to be blown. The silicidation process does not affect the correct e-fuse operation in that a protection layer 254, 354 is formed on a predetermined surface portion of the semiconductor layer 244, 344 lying above a portion of the metal layer 224, 324 which is to be protected. The portion of the metal layer to be protected includes a narrow portion arranged between a first anode and a second anode situated at opposite end portions of the metal layer. In this manner, the portion of semiconductor layer lying between the metal layer portion to be protected and the protection layer is prevented from taking part in the silicidation process. Thus, after the silicidation process, no silicide material is formed above the metal layer portion to be protected.

The claimed method and e-fuse may be applied to all manufacturing technologies starting from 45 nm and beyond and, in particular, to the 28-nm technology and beyond.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An electrically programmable fuse for an integrated semiconductor device, comprising:
    a metal layer positioned above a surface of a substrate, said metal layer comprising a first electrode and a second electrode positioned at opposite end portions of said metal layer, wherein an entirety of said metal layer has a substantially planar surface that is positioned a same first distance above said surface of said substrate;
    a semiconductor layer positioned above said metal layer;
    a silicidation protection layer positioned in direct contact with and covering at least a first portion of said semiconductor layer that is positioned above and covers at least a corresponding first portion of said metal layer underlying said first portion of said semiconductor layer, wherein said silicidation protection layer is adapted to prevent silicidation of said at least covered first portion of said semiconductor layer; and
    electrical connections to said first electrode and said second electrode, at least a portion of said electrical connections extending through an interlayer dielectric material positioned above said electrically programmable fuse.

2. The electrically programmable fuse of claim 1, wherein a portion of said metal layer is adapted to rupture when subjected to a current flow having a current intensity that exceeds a predetermined threshold.

3. The electrically programmable fuse of claim 1, wherein said semiconductor layer covers an entirety of an upper surface of said metal layer.

4. The electrically programmable fuse of claim 1, wherein said metal layer comprises at least one of titanium nitride (TiN), tantalum nitride (TaN), tantalum (Ta) and tungsten (W).

5. The electrically programmable fuse of claim 1, wherein said metal layer comprises a work function metal comprising a transistor gate structure of said integrated semiconductor device.

6. The electrically programmable fuse of claim 1, wherein said metal layer further comprises a neck portion that is positioned between and electrically connects said first electrode and said second electrode, an entirety of said neck portion having a lateral width when viewed from above that is less than a lateral width of an entirety of said first electrode and said second electrode when viewed from above.

7. The electrically programmable fuse of claim 1, further comprising a high-k material layer positioned between said substrate and said metal layer.

8. The electrically programmable fuse of claim 1, wherein said silicidation protection layer covers an entire upper surface of said metal layer.

9. The electrically programmable fuse of claim 1, wherein said at least said corresponding first portion of said metal layer comprises a neck portion that is positioned between and electrically connects said first electrode and said second electrode and wherein said silicidation protection layer is not positioned above and does not cover upper surfaces of said first electrode and said second electrode.

10. The electrically programmable fuse of claim 9, wherein at least one of said electrical connections comprises a metal silicide layer in electrical contact with said metal layer.

11. The electrically programmable fuse of claim 1, wherein a portion said silicidation protection layer is positioned laterally adjacent to and covering sidewall surfaces of at least said semiconductor layer.

12. The electrically programmable fuse of claim 1, wherein at least one of said electrical connections is a conductive contact element that is positioned in an aperture that extends continuously through said silicidation protection layer and said semiconductor layer so as to expose a predetermined surface portion of said metal layer, and wherein said conductive contact element extends continuously through and is laterally surrounded by said silicidation protection layer and said semiconductor layer and physically contacts said predetermined surface portion of said metal layer, said conductive contact element comprising an electrically conductive material.

13. A method of forming an electrically programmable fuse for an integrated semiconductor device comprising:
    forming a metal layer above a surface of a substrate, wherein an entirety of said metal layer has a substantially planar surface that is positioned a same first distance above said surface of said substrate;
    forming a semiconductor layer above said metal layer;
    patterning said metal layer so as to form a first electrode at a first end of portion of said electrically programmable fuse and a second electrode at a second end portion of said electrically programmable fuse that is opposite of said first end portion;
    forming a silicidation protection layer in direct contact with a portion of said semiconductor layer, wherein said silicidation protection layer covers and prevents silicidation of said portion of said semiconductor layer and covers a corresponding portion of said metal layer underlying said covered portion of said semiconductor layer; and
    forming electrical connections to said first electrode and said second electrode.

14. The method of claim 13, wherein said silicidation protection layer is formed after patterning said metal layer.

15. The method of claim 13, further comprising forming a high-k material layer above said surface of said substrate, said metal layer being formed above said high-k material layer.

16. The method of claim 13, wherein forming said silicidation protection layer comprises forming said silicidation protection layer so as to cover an entire upper surface of said metal layer.

17. The method of claim 13, wherein forming said electrical connections to said first electrode and said second electrode comprises:
forming at least one aperture that extends continuously through and is surrounded by said silicidation protection layer and said semiconductor layer, said at least one aperture exposing a predetermined surface portion of said metal layer of at least one of said first and second electrodes; and
after forming said at least one aperture extending continuously through said silicidation protection layer and said semiconductor layer, forming a conductive contact element in said at least one aperture by performing a deposition process to fill an entirety of said at least one aperture with a conductive metal, wherein said conductive contact element physically contacts said exposed predetermined surface portion of said metal layer and extends continuously through and is laterally surrounded by said silicidation protection layer and said semiconductor layer.

18. The method of claim 13, wherein patterning said metal layer comprises forming a neck portion of said electrically programmable fuse that extends between and electrically connects said first electrode and said second electrode and wherein forming said silicidation protection layer comprises forming said silicidation protection layer above and covering said neck portion but not above or covering said first and second electrodes.

19. The method of claim 18, wherein forming said electrical connections to said first electrode and to said second electrode comprises performing a silicidation process in the presence of said silicidation protection layer so as to form a first silicide layer electrically contacting said first electrode and a second silicide layer electrically contacting said second electrode.

20. The method of claim 13, wherein patterning said metal layer comprises forming an etch mask above and covering a first portion of said metal layer and performing at least one etch process in the presence of said etch mask so as to remove at least a second portion of said metal layer that is not covered by said etch mask.

21. The method of claim 13, wherein patterning said metal layer comprises forming an etch mask above and covering a first portions of said semiconductor layer and said metal layer and performing at least one etch process in the presence of said etch mask so as to remove second portions of said metal layer and said semiconductor layer that are not covered by said etch mask.

22. The method of claim 13, wherein forming said silicidation protection layer comprises forming a portion of said silicidation protection layer laterally adjacent to and covering sidewall surfaces of at least said semiconductor layer.

23. The method of claim 13, wherein forming said forming said electrical connections comprises extending at least a portion of said electrical connections through an interlayer dielectric material formed above said electrically programmable fuse.

* * * * *